(12) United States Patent
Gregg et al.

(10) Patent No.: US 6,682,617 B2
(45) Date of Patent: Jan. 27, 2004

(54) METHOD FOR MAKING WALLBOARD OR BACKERBOARD SHEETS INCLUDING AERATED CONCRETE

(75) Inventors: Frederick Browne Gregg, Leesburg, FL (US); Leslie G. Bromwell, Auburndalo, FL (US)

(73) Assignee: Consolidated Minerals, Inc., Leesburg, FL (US)

( * ) Notice: Subject to any disclaimer, the term of this patent is extended or adjusted under 35 U.S.C. 154(b) by 0 days.

(21) Appl. No.: 10/079,732

(22) Filed: Feb. 21, 2002

(65) Prior Publication Data

US 2002/0100532 A1 Aug. 1, 2002

Related U.S. Application Data

(62) Division of application No. 09/680,720, filed on Oct. 6, 2000, now Pat. No. 6,409,855.
(60) Provisional application No. 60/158,172, filed on Oct. 7, 1999.

(51) Int. Cl.[7] .................................................. B28B 1/50
(52) U.S. Cl. .............................. 156/40; 156/43; 156/45; 264/333
(58) Field of Search .............................. 156/39, 40, 42, 156/43, 45, 46; 264/42, 145, 157, 158, 333

(56) References Cited

U.S. PATENT DOCUMENTS

| | | | | |
|---|---|---|---|---|
| 1,439,954 A | * | 12/1922 | Emerson .................... | 428/140 |
| 3,395,204 A | | 7/1968 | Olsson et al. .............. | 264/157 |
| 3,595,947 A | | 7/1971 | Wielinga .................... | 264/42 |

(List continued on next page.)

FOREIGN PATENT DOCUMENTS

| | | | |
|---|---|---|---|
| CA | 2146216 | 10/1996 | |
| DE | 213 558 | 9/1984 | ............ H02G/9/02 |
| EP | 0 503 383 | 9/1992 | |
| GB | 760 312 A | 10/1956 | |
| GB | 1 302 540 | 1/1973 | ............ B22B/5/18 |
| JP | 2 194904 | 8/1990 | ............ G25B/1/50 |
| JP | 5 293 813 | 11/1993 | ........... B28B/11/22 |
| WO | 95/11357 | 4/1995 | |
| WO | 97/40239 | 10/1997 | |

OTHER PUBLICATIONS

Patent Abstracts of Japan, vol. 018, No. 083 & JP 05 293813; Applicant: Asahi Chem Ind. dated Nov. 9, 1993—abstract.
Patent Abstracts of Japan, vol. 1014, No. 481 & JP 02 194904 A; Applicant: Matsushita Electric Works Ltd. dated Aug. 1, 1990—abstract.

*Primary Examiner*—Jeff H. Aftergut
*Assistant Examiner*—Todd J. Kilkenny
(74) *Attorney, Agent, or Firm*—Allen, Dyer, Doppelt, Milbrath & Gilchrist, P.A.

(57) ABSTRACT

A method for making wallboard or backerboard sheets which are relatively lightweight, strong, and which have good fire resistance, thermal insulation, and sound absorbing properties includes forming core material having opposing first and second major surfaces and comprising aerated concrete, securing at least one face layer on at least one of the first and second major surfaces of the core material, and cutting the core material and at least one face layer secured thereto into a plurality of wallboard or backerboard sheets. The provision of aerated concrete for the core provides many key advantages over conventional gypsum wallboard sheets, and/or conventional backerboard sheets, such as gypsum greenboard or cementitious backerboard, for example. In one class of embodiments, the method may further include curing the core material prior to securing the at least one face layer thereto. In another class, the method may further include curing the core material after securing the at least one face layer thereto.

7 Claims, 10 Drawing Sheets

U.S. PATENT DOCUMENTS

| | | | |
|---|---|---|---|
| 3,697,355 A | 10/1972 | Black | 156/319 |
| 3,929,947 A | 12/1975 | Schwartz et al. | 264/42 |
| 4,047,355 A | 9/1977 | Knorr | 52/738 |
| 4,065,333 A | 12/1977 | Lawlis et al. | 156/40 |
| 4,124,669 A | 11/1978 | Urmston | 264/42 |
| 4,154,040 A * | 5/1979 | Pace | 52/521 |
| 4,203,788 A * | 5/1980 | Clear | 156/44 |
| 4,298,413 A * | 11/1981 | Teare | 156/42 |
| 4,357,289 A | 11/1982 | Jakobsson | 264/42 |
| 4,551,384 A | 11/1985 | Aston et al. | 428/312.6 |
| 4,902,211 A | 2/1990 | Svanholm | 425/88 |
| 5,002,620 A | 3/1991 | King | 156/153 |
| 5,221,386 A | 6/1993 | Ensminger et al. | 156/40 |
| 5,552,187 A | 9/1996 | Green et al. | 427/389.8 |
| 6,187,409 B1 * | 2/2001 | Mathieu | 428/70 |

* cited by examiner

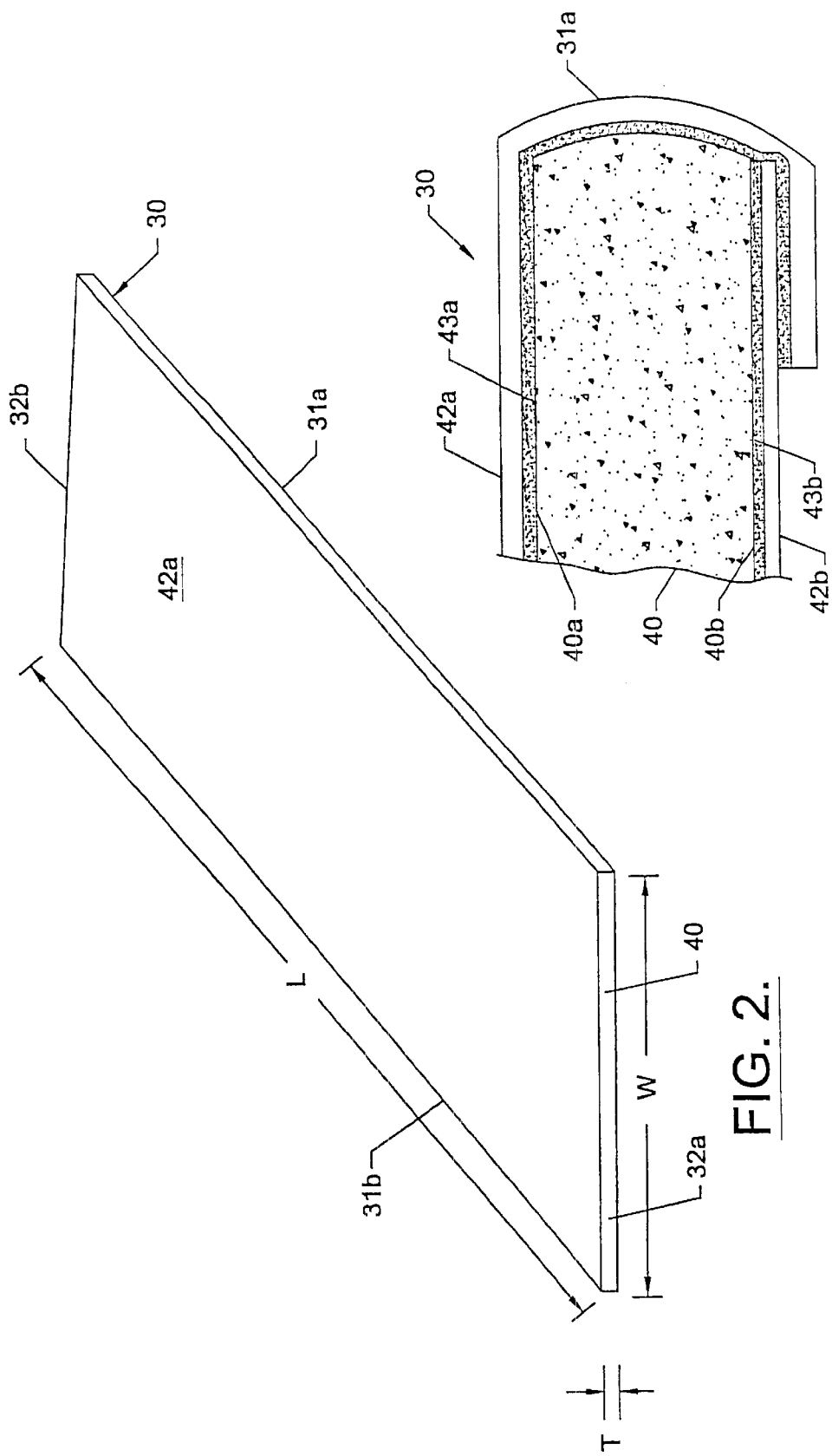

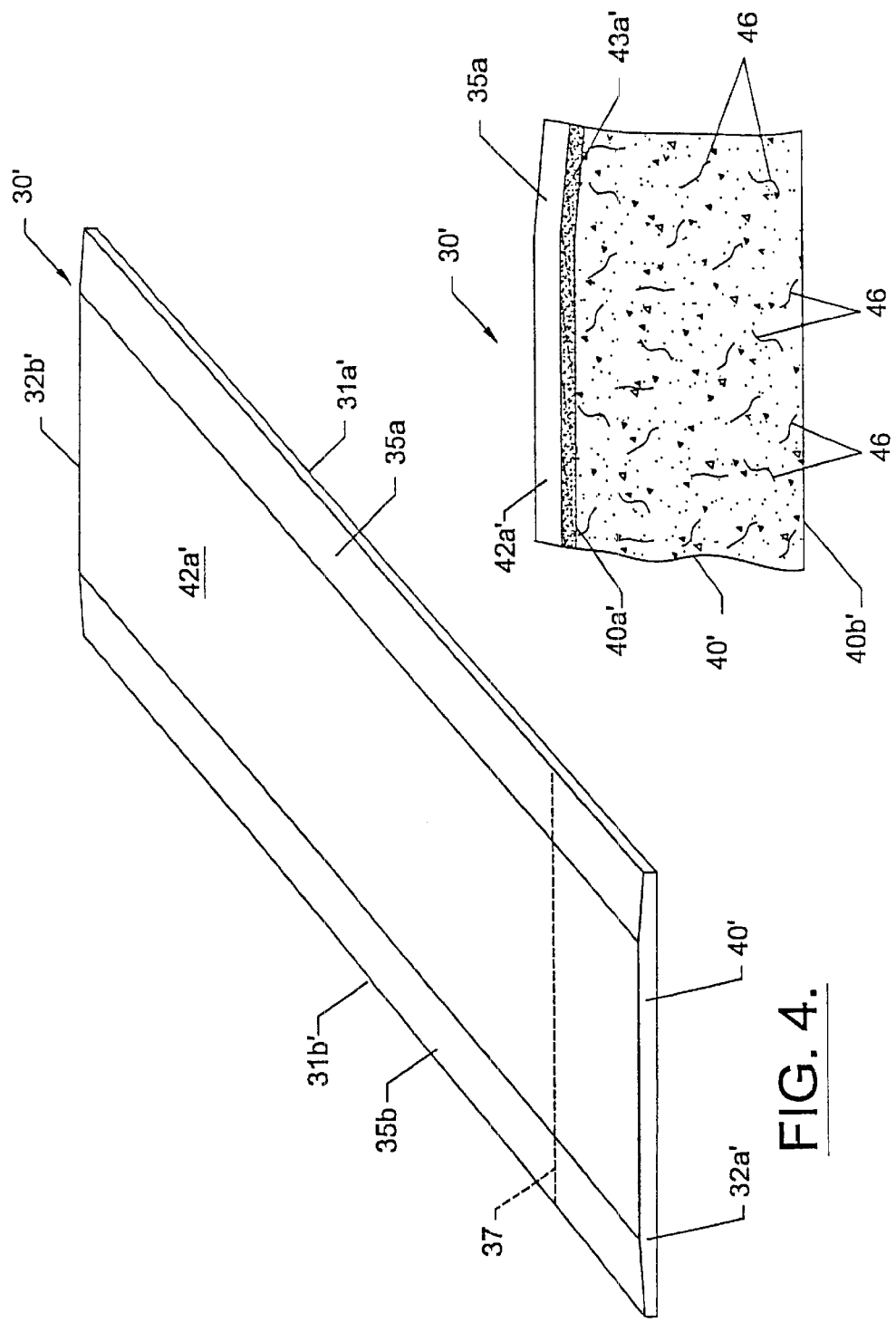

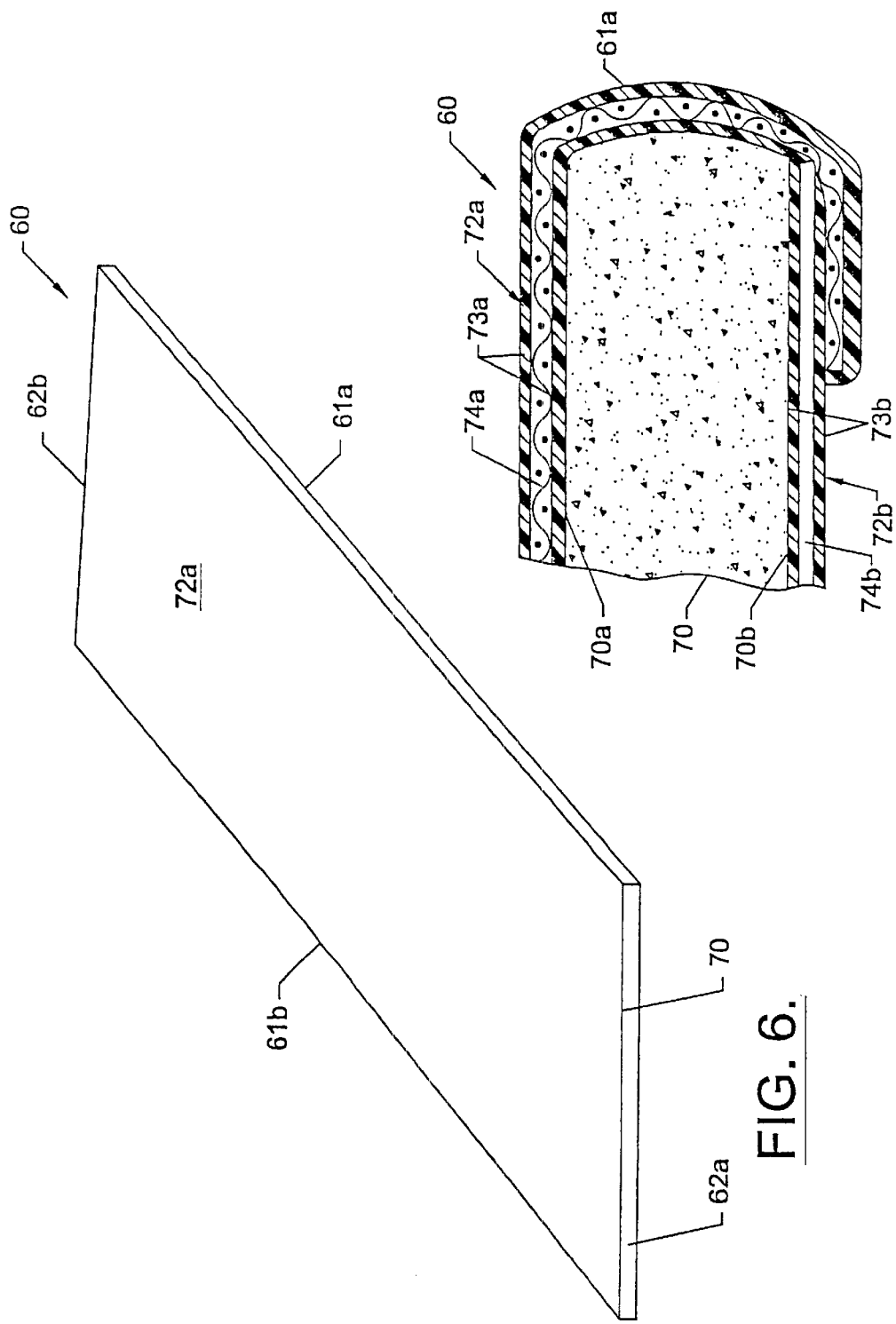

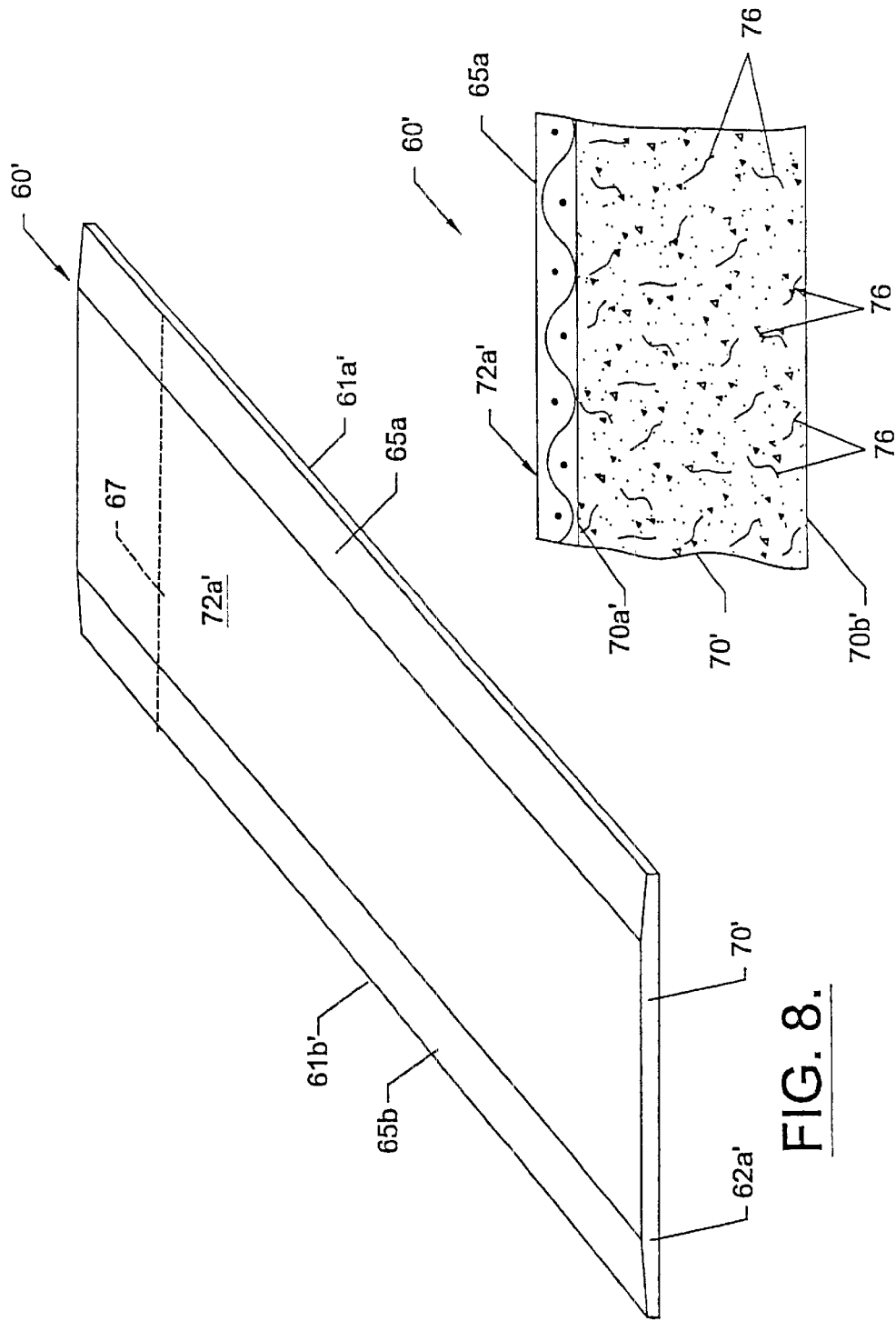

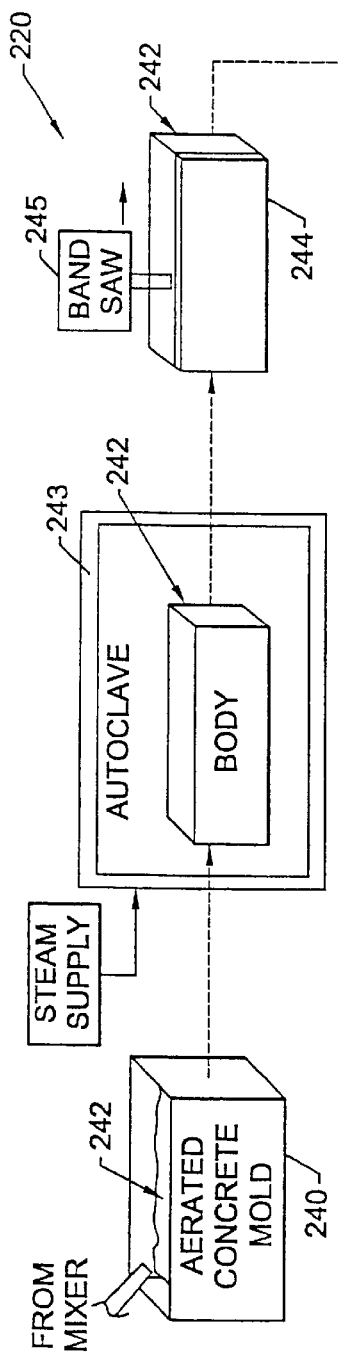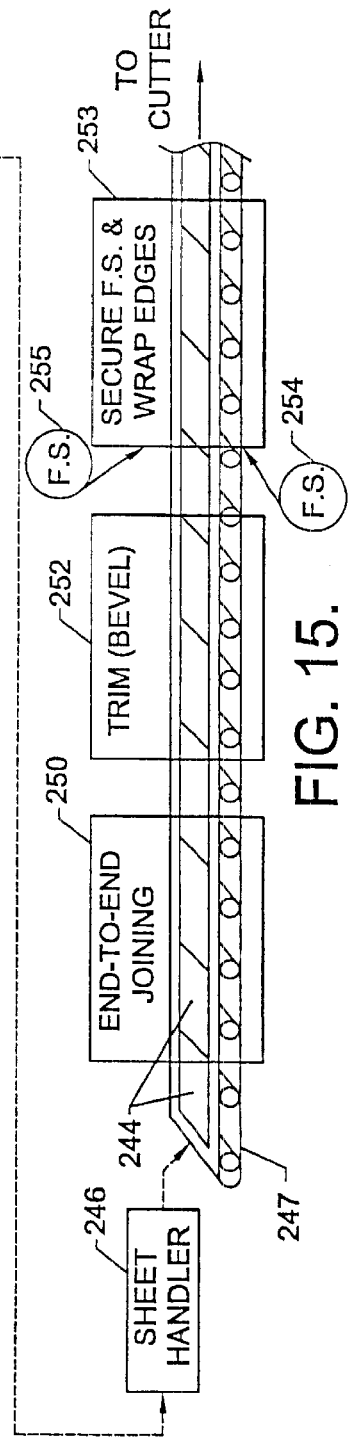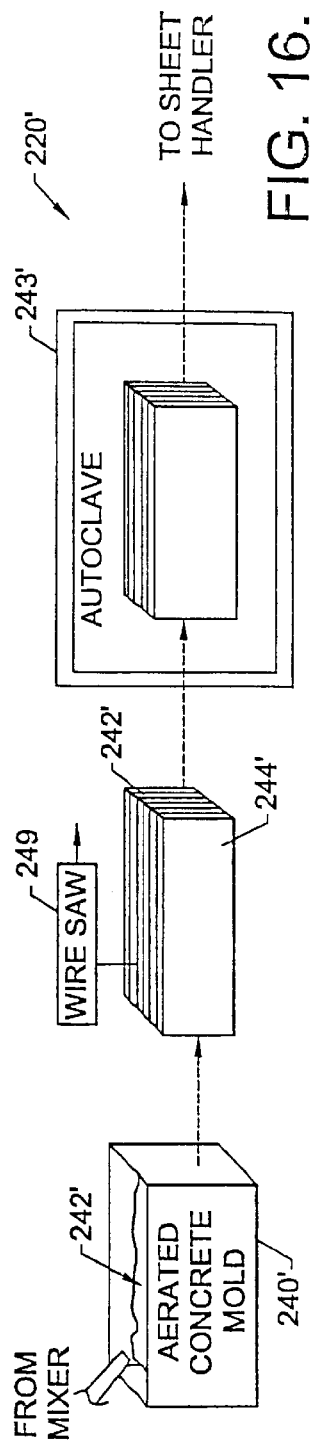

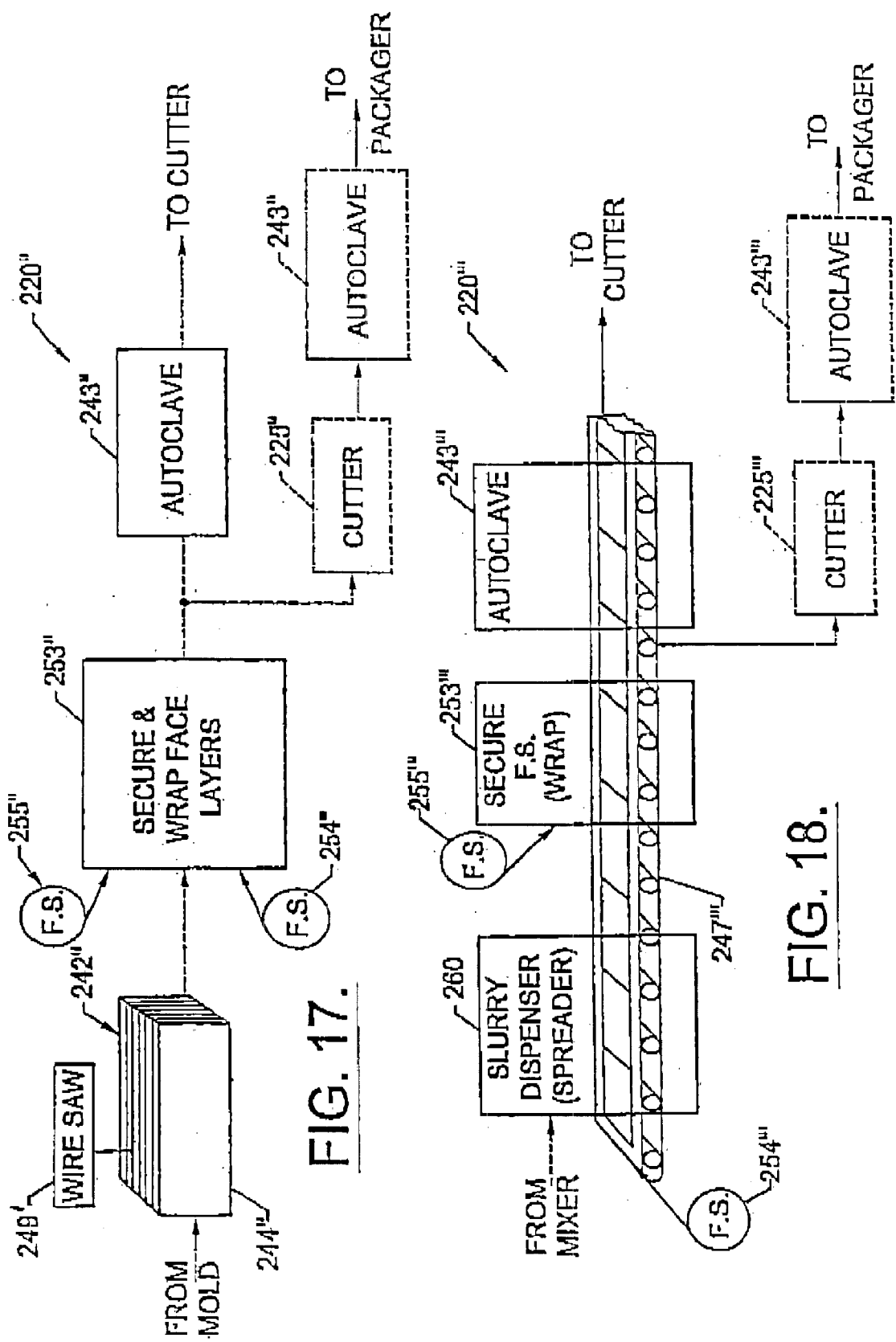

METHOD FOR MAKING WALLBOARD OR BACKERBOARD SHEETS INCLUDING AERATED CONCRETE

RELATED APPLICATION

The present application is based upon U.S. provisional patent application Ser. No. 60/158,172 filed Oct. 7, 1999, the entire disclosure of which is incorporated herein by reference. Also, the present application is a divisional application of U.S. patent application Ser. No. 09/680,720 filed Oct. 6, 2000 and issued as U.S. Pat. No. 6,409,855.

FIELD OF THE INVENTION

The present invention relates to the field of manufacturing construction products, and, more particularly, to methods for making lightweight, high-strength, fire-resistant wallboard sheet, and/or moisture-resistant backerboard sheets.

BACKGROUND OF THE INVENTION

Wallboard sheets are widely used in building construction to form partitions or walls of rooms, elevator shafts, stair wells, ceilings, etc. The sheets are typically fastened to a suitable supporting framework. The seams between sheets are covered to provide an even wall surface. The sheets may be readily cut to size by first scoring the face sheet, and then snapping the board about the score line. The wall may then be painted or covered with a decorative wall covering, if desired. Such wallboard sheets created from a gypsum core with outer face layers of paper, sometimes referred to as gypsum board or drywall, are well known.

Gypsum wallboard is typically manufactured by delivering a slurry or paste containing crushed gypsum rock onto a moving sheet of facing paper to which a second or top paper layer is then added to form a long board line. The board line permits the slurry to harden before being cut. The cut panels are heated in a kiln, before being packaged for storage and shipping.

Typically, such sheets are ½ or ⅝ inch thick and in conventional sizes of 4×8 feet, such a gypsum wallboard sheet may weigh about 55–70 pounds. Accordingly, handling of such gypsum wallboards presents a significant task for construction personnel or wallboard "hangers", particularly when such boards are secured overhead to form a ceiling. In addition, the fire resistance, thermal insulation and sound absorbing properties of conventional gypsum wallboard sheets may not be sufficient for some applications.

Another variation of gypsum wallboard is water-resistant drywall or "greenboard". The greenboard typically includes the same gypsum core, but includes a water-resistant facing so the water is less likely to penetrate, stain and/or decay the wall. Greenboard is typically used for walls in a moist or humid environment, such as a bathroom, for example. Such greenboard is not typically recommended as an underlayment for tile in the bathroom, for example, since water may penetrate the grout or cracks between adjacent tiles and deteriorate the greenboard. U.S. Pat. No. 5,552,187 to Green et al. discloses the addition of a fibrous mat-faced gypsum board coated with a water-resistant resinous coating for greater durability in moist environments.

Yet another related conventional wallboard product to serve as an underlayment for wet areas is the concrete backerboard. For example, UTIL-A-CRETE® Backerboard from Bonsal is a precast cementitious backboard with glass mesh reinformcement. The board includes portland cement, fiber glass mesh and lightweight aggregate. The backerboard is more adapted to be used in areas subject to splashing or high moisture.

While the glass mesh face layers are typically secured to the surface of the backerboard after the core has been precast, continuous production is also disclosed in U.S. Pat. No. 5,221,386 to Ensminger et al. In addition, the mesh or reinforcing layers have also been embedded in the faces and edges of the backerboards.

Unfortunately, conventional cementitious backerboards may be more difficult to score and break to size. Moreover, since the backerboards include a core of cement, their density is considerably greater than even conventional gypsum wallboard. Accordingly, manufacturers may offer the backerboards in smaller sizes to be more readily handled by the installer, but such increases seams between sheets and also increases costs of installation. A typically sized 4 foot by 8 foot sheet can weigh well over 100 pounds, which is very unwieldy especially in confined spaces.

SUMMARY OF THE INVENTION

In view of the foregoing background, it is therefore an object of the invention to provide a method for making wallboard or backerboard sheets which are relatively lightweight, strong, and which have good fire resistance, thermal insulation, and sound absorbing properties.

This and other objects, features and advantages in accordance with the present invention are provided by a method comprising forming core material having opposing first and second major surfaces and comprising aerated concrete, securing at least one face layer on at least one of the first and second major surfaces of the core material, and cutting the core material and at least one face layer secured thereto into a plurality of wallboard or backerboard sheets. The provision of aerated concrete for the core provides many key advantages over conventional gypsum wallboard sheets, and/or conventional backerboard sheets, such as gypsum greenboard or cementitious backerboard, for example.

In one class of embodiments, the method may further comprise curing the core material prior to securing the at least one face layer thereto. In another class, the method may further comprise curing the core material after securing the at least one face layer thereto.

In one particularly advantageous embodiment, forming the core material comprises dispensing materials for making aerated concrete into a mold and allowing the materials to rise and stiffen into a body, curing the body, and dividing the cured body into a plurality of cured sheets to serve as the core material. The plurality of the cured sheets may be joined together in end-to-end relation while advancing the cured sheets along a path of travel. In addition, securing the at least one face layer may be performed while the cured sheets are advanced along the path of travel.

In another embodiment, forming the core material comprises dispensing materials for making aerated concrete into a mold and allowing the materials to rise and stiffen into a body, dividing the body into a plurality of uncured sheets, and curing the sheets to serve as the core material. This embodiment may also include joining the plurality of the cured sheets together in end-to-end relation while advancing the cured sheets along a path of travel. Additionally, the at least one face layer may also be secured while the cured sheets are advanced along the path of travel.

In yet another embodiment, forming the core material comprises dispensing materials for making aerated concrete into a mold and allowing the materials to rise and stiffen into a body, and dividing the body into a plurality of uncured sheets to serve as the core material. In this embodiment, curing of the uncured sheets occurs after securing the at least one face layer thereto. Curing may also be performed after cutting. A high temperature resistant face layer may be required where curing is performed after securing of the one or more face layers.

In accordance with still another embodiment of the invention, the method includes mixing and dispensing the materials for making aerated concrete in slurry form, and wherein securing the at least one face layer comprises receiving the aerated concrete in slurry form thereon as the at least one face layer is advanced along a path of travel. This embodiment may also include permitting the aerated concrete material to rise and stiffen, and curing the liquid aerated concrete after rising and stiffening. The curing may also be after cutting.

The securing the at least one face layer may comprise securing first and second face layers on respective first and second major surfaces of the core material. The at least one face layer may comprise paper, such as for a wallboard. Alternately, the at least one face layer may be moisture-resistant for a backerboard.

The method may also include forming the first major surface of the core material to have beveled portions adjacent respective opposing longitudinal side edges. Securing the at least one face layer may include securing the at least one face layer to extend around the opposing longitudinal side edges. In addition, forming the core material may comprise forming the core material with reinforcing fibers in the aerated concrete.

BRIEF DESCRIPTION OF THE DRAWINGS

FIG. 2 is a perspective view of a wallboard sheet as can be used in the wall structure of FIG. 1.

FIG. 3 is an enlarged cross-sectional view through a side edge of the wallboard sheet as shown in FIG. 2.

FIG. 4 is a perspective view of another embodiment of a wallboard sheet as can be used in the wall structure of FIG. 1.

FIG. 5 is an enlarged cross-sectional view through a beveled portion of the wallboard sheet as shown in FIG. 4.

FIG. 6 is a perspective view of a backerboard sheet as can be used in the wall structure of FIG. 1.

FIG. 7 is an enlarged cross-sectional view through a side edge of the backerboard sheet as shown in FIG. 6.

FIG. 8 is a perspective view of another embodiment of a backerboard sheet as can be used in the wall structure of FIG. 1.

FIG. 9 is an enlarged cross-sectional view through a beveled portion of the backerboard sheet as shown in FIG. 8.

FIG. 15 is a more detailed schematic diagram of a former embodiment for the system as shown in FIG. 14.

FIG. 16 is a more detailed schematic diagram of an alternative portion of the former embodiment as shown in FIG. 15.

FIG. 17 is a more detailed schematic of another former embodiment and variation thereof for the system of FIG. 14.

FIG. 18 is a more detailed schematic of still another former embodiment and variation thereof for the system of FIG. 14.

DETAILED DESCRIPTION OF THE PREFERRED EMBODIMENTS

Figure 1:
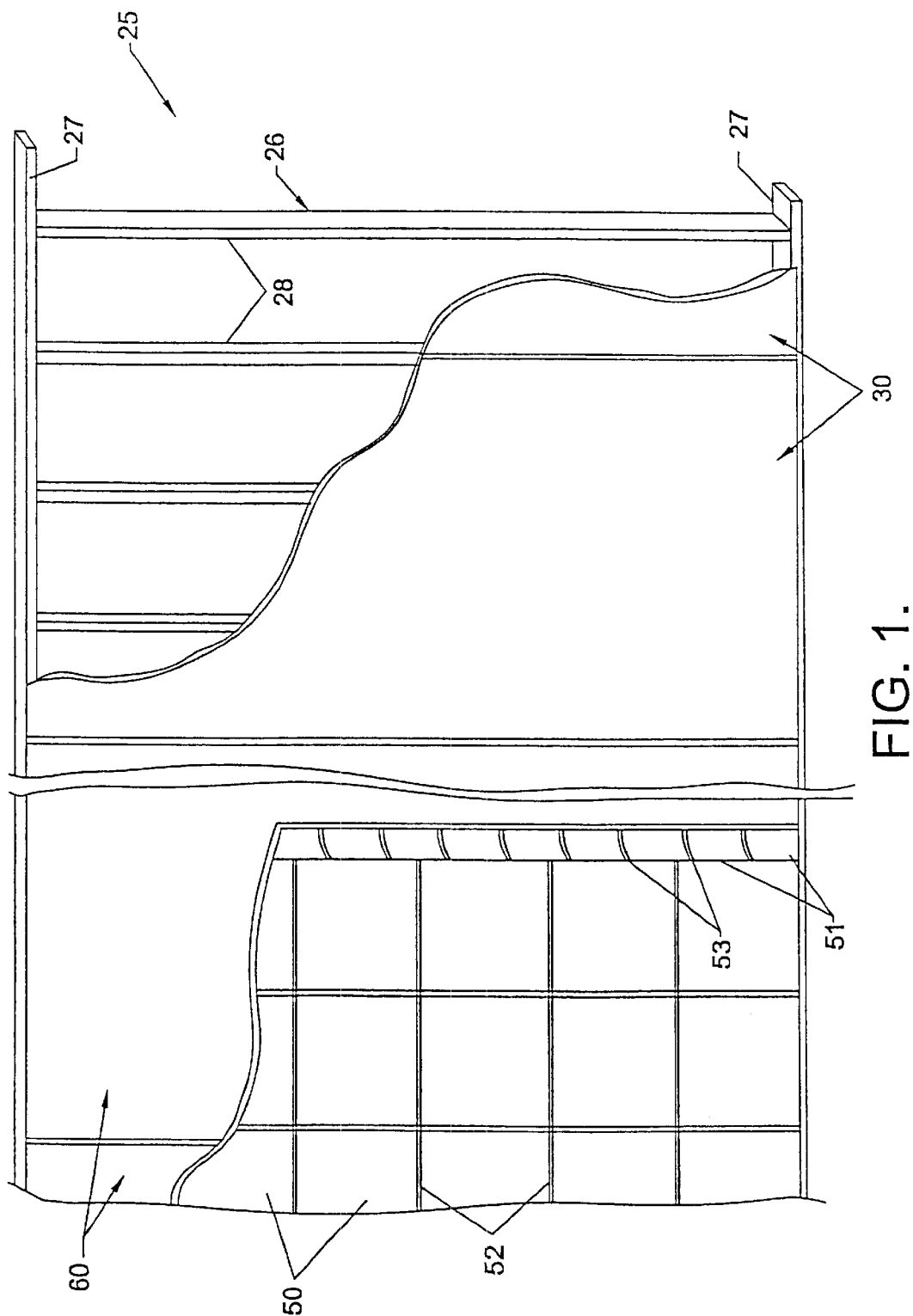
FIG. 1 is a schematic view of a portion of a wall structure including the wallboard and/or backerboard in accordance with the present invention with various layers removed for clarity of explanation.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime and multiple prime notation are used in alternate embodiments to indicate similar elements.

The present invention is based, at least in part, upon the recognition of the various shortcomings of prior art gypsum wallboard and/or cementitious backerboard sheets, and the further recognition that the use of aerated concrete as the core material overcomes a number of the shortcomings. As it is also known autoclaved aerated concrete is a high-quality, load-bearing, as well as insulating building material produced in a wide range of product sizes and strengths. The material has been used successfully in Europe and is now among widely used wall building materials in Europe with increasing market shares in other countries.

Aerated concrete is a steam cured mixture of sand or pulverized fuel ash, cement, lime and an aeration agent. High pressure steam curing in an autoclave produces a physically and chemically stable product with an average density being about one fifth that of normal concrete. The material includes non-connecting air cells, and this gives aerated concrete some of it its unique and advantageous properties. Aerated concrete enjoys good strength, low weight, good thermal insulation properties, good sound deadening properties, and has a high resistance to fire.

Aerated concrete may be used in the form of panels or individual building blocks. It has been used for residences; commercial, industrial and agricultural buildings; schools; hospitals; etc. and is a good material in most all climates. Panels or blocks may be joined together using common mortar or thin set glue mortar or adhesive. Aerated concrete has durability similar to conventional concrete or stone and a workability perhaps better than wood. The material can be cut or sawn and readily receives expandable fasteners. Aerated concrete has a thermal insulation six to ten times better than conventional concrete. The material is also non-rotting, non-toxic and resistant to termites.

As disclosed in U.S. Pat. No. 4,902,211 to Svanholm, for example, aerated concrete may typically be produced as follows. One or several silica containing materials, such as sand, shale ashes or similar materials, as well as one or more calcareous binders, such as lime and/or cement, are mixed with a rising or aeration agent. The aeration agent typically includes aluminum powder which reacts with water to develop hydrogen gas at the same time a mass of what can be considered a calcium silicate hydrate forms. The development of hydrogen gas gives the mass macroporosity. The rising mass is typically contained within a mold. After rising, the mass is permitted to stiffen in the mold forming a semiplastic body which has low strength, but which will keep together after removal from the mold.

After a desired degree of stiffness is achieved and the body is removed from the mold, the body may typically be divided or cut by wires into separate elements having the desired shape, such as building blocks or larger building panels. The divided body is positioned in an autoclave where it is steam cured at high pressure and high temperature to obtain suitable strength. The body is then advanced to a separation station where the adjacent building blocks or panels are separated from one another. The blocks are packaged, such as onto pallets for storage and transportation.

Referring now initially to FIGS. 1–5 a wallboard sheet 30 in accordance with the present invention is now described. The wallboard sheet 30 may be used to form part or all of an interior wall structure, such as the right hand portion of the wall structure 25 (FIG. 1). Of course, the wallboard sheet 30 could be used for ceilings, interior partitions, elevator shafts, etc, as will be appreciated by those skilled in the art. The wall structure 25 will typically include a frame 26 formed of horizontal and vertical wall studs or members, 27, 28, respectively, to which the wallboard sheets 30 are secured by suitable fasteners and/or adhesive.

The wallboard sheet 30 includes a core 40 having opposing first and second major surfaces 40a, 40b, respectively, and at least one face layer on at least one of the first and second major surfaces of the core. The core 40 includes aerated concrete. The provision of aerated concrete for the core provides many key advantages over conventional wallboard sheets, such as gypsum wallboard, for example. The core 40 may be produced from a mixture of Portland cement, quick lime, sand, aluminum powder and water, although at least some of the sand and perhaps some of the quick lime can be replaced by flyash. In general, the flyash may be used as at least a partial replacement for sand in the mix, but flyash, depending on its composition, may react with the aluminum powder in a manner similar to quick lime to produce the micro-cellular bubbles in the expanded aerated concrete.

In the first embodiment of the wallboard sheet 30, both first and second face layers 42a, 42b, respectively, are adhesively secured to the opposing first and second major surfaces 40a, 40b of the core 40 via respective adhesive layers 43a, 43b. In other embodiments, the adhesive may be incorporated into the face layers and/or the surface portion of the aerated concrete core as will be appreciated by those skilled in the art. One or both of the face layers 42a, 42b may comprise paper, having colors and/or weights, for example, similar to conventional gypsum wallboard paper.

The core 40 and hence the wallboard sheet 30 may have a generally rectangular shape defining a pair of opposing side edges 31a, 31b, respectively, and a pair of opposing end edges 32a, 32b, respectively. The first face layer 42a may extend around the opposing side edges 31a, 31b as shown perhaps best in the enlarged cross-sectional view of FIG. 3. In addition, the opposing end edges 32a, 32b of the core may be exposed (FIG. 2). If desired, a tape, not shown, may be provided on the opposing ends 32a, 32b as will be appreciated by those skilled in the art.

The aerated concrete core 40 may have a relatively low density in a range of about 25 to 40 lbs./ft.$^3$ The core 40 and hence the sheet 30, as well, may also have a thickness T in a range of about ¼ to 1 inch, a width W in a range of about three to five feet, and a length L in a range of about five to sixteen feet. Accordingly, even a 1 inch thick, 4 foot by 8 foot wallboard sheet 30 may have a relatively low total weight of about 60 pounds.

Referring now more particularly to the embodiment of the wallboard sheet 30' shown in FIGS. 4 and 5, other aspects of the invention are now explained. The illustrated wallboard sheet 30' includes beveled portions 35a, 35b formed on the first major surface 40a' of the core 40' adjacent respective opposing side edges 31a', 31b'. The beveled portions 35a, 35b may facilitate the receipt of taping and joint compound to cover the joints between adjacent sheets 30' in the finished wall structure.

As perhaps best shown in FIG. 5, the illustrated embodiment of the wallboard sheet 30' also includes only a single face layer 42a', although in other embodiments, a second face layer may be applied as well. In addition, the illustrated embodiment of the core 40' includes schematically illustrated reinforcing fibers 46. The fibers 46 may be provided by a fibrous material, such as cellulose or other natural or synthetic fibers, including fiberglass, metal or other materials, to impart strength to the core and reduce the relative brittleness of the aerated concrete.

Another aspect of the wallboard sheet 30' is that it includes a joint schematically illustrated by the dashed line 37 extending across the width of the sheet as may be formed during the manufacturing thereof and as will be explained in greater detail herein. The joint 37 can be stronger than the adjacent core material, and without compromising the ability to score and snap break the wallboard sheet 30' as conveniently as with conventional gypsum wallboard. Stated slightly differently, some embodiments of the wallboard sheet 30' may include first and second portions on opposite sides of the joint 37 aligned in end-to-end relation at respective opposing edges thereof, and an adhesive layer may be used to join the opposing edges of the first and second portions together.

The other elements of the wallboard sheet 30' indicated with prime notation and not specifically mentioned are similar to those elements described above with reference to the wallboard sheet 30 described above. Accordingly, these elements need no further discussion herein. Those of skill in the art will also appreciate that the various features of the embodiments of the wallboard sheets 30, 30' can be mixed and/or substituted in yet further embodiments of the invention.

Because of the relative light weight of the wallboard sheets 30, 30' including aerated concrete, shipping, handling, and installation at a job site are facilitated. In addition, the substitution of aerated concrete for gypsum, for example, also offers the advantages of increased fire resistance, thermal insulation, sound deadening, and other properties in a wall structure formed by fastening the aerated concrete wallboard sheets to a suitable building frame.

Returning again briefly to FIG. 1 and additionally to FIGS. 6–9, a backerboard sheet 60 in accordance with the present invention is now described. More particularly, as shown in the left hand portion of FIG. 1, the backerboard sheets 60 may be used where the wall is likely to be exposed to splashing water or moisture, such as a bathroom, and other indoor areas as will be appreciated by those skilled in the art. The backerboard sheet 60 is also typically used as an underlayment substrate for decorative area tile 50 and/or border tile 51 as shown in the left hand portion of FIG. 1. Adjacent ones of the tiles 50, 51 typically include grout lines 52, 53 therebetween through which moisture may penetrate. In addition, cracks may form in the grout lines or the tiles themselves through which moisture may also penetrate.

Conventional gypsum greenboard or cementitious sheets for such high-moisture applications suffer a number of significant shortcomings and disadvantages as highlighted in the background of the invention section above. The backerboard sheet 60 including a core 70 comprising aerated concrete, and at least one moisture-resistant face layer overcomes these shortcomings and disadvantages.

In the first illustrated embodiment of the backerboard sheet 60, both first and second moisture-resistant face layers 72a, 72b, respectively, are secured to the opposing first and second major surfaces 70a, 70b of the core 70. Each moisture-resistant face layer 72a, 72b illustratively includes a woven fiber mesh 74a, 74b incorporated into a respective resin layer 73a, 73b. The fibers may include at least one of glass, plastic, and metal. The moisture-resistant face layer may have other constructions and be formed of different moisture-resistant materials, such as those commonly used for cementitious backerboard, and others as will be appreciated by those skilled in the art. For example, moisture resistant face layers include nylon, aramid resin, or metal fibers as disclosed in U.S. Pat. No. 5,221,386 may also be used, and the entire contents of this patent are incorporated herein by reference.

The core 70 and hence the backerboard sheet 60 may also have a generally rectangular shape defining a pair of opposing side edges 61a, 61b, respectively, and a pair of opposing end edges 62a, 62b, respectively. The first face layer 72a may also extend around the opposing side edges 61a, 61b as shown perhaps best in the enlarged cross-sectional view of FIG. 7. In addition, the opposing end edges 72a, 72b of the core may be exposed (FIG. 6). If desired, a tape, not shown, may be provided on the opposing ends 62a, 62b as will be appreciated by those skilled in the art. In addition, the aerated concrete core 70 may have the same characteristics and sizes as mentioned above with respect to the wallboard sheets 30, 30', for example.

Referring now more particularly to the embodiment of the backerboard sheet 60' shown in FIGS. 8 and 9, other aspects of the invention are now explained. The illustrated backerboard sheet 60' includes beveled portions 65a, 65b formed on the first major surface 70a' of the core 70' adjacent respective opposing side edges 61a', 61b'. The beveled portions 65a, 65b may facilitate the receipt of taping and sealing or joint compound to cover the joints between adjacent sheets 60' in the finished wall structure.

As perhaps best shown in FIG. 9, the illustrated embodiment of the backerboard sheet 60' also includes only a single moisture-resistant face layer 72a', although in other embodiments, a second face layer may be applied as well. The moisture-resistant face layer 72a' is also illustratively directly secured to the core 70, although an incorporated resin or adhesive may be used in other embodiments.

The illustrated embodiment of the core 70' includes schematically illustrated reinforcing fibers 76. The fibers 76 may be provided by a fibrous material, such as cellulose or other natural or synthetic fibers, including fiberglass, metal or other materials, to impart strength to the core and reduce the relative brittleness of the aerated concrete. The fibers may also be desirably selected to avoid attracting or retaining moisture.

Another aspect of the backerboard 60', similar to the wallboard 30' discussed above, is that it includes a joint schematically illustrated by the dashed line 67 extending across the width of the sheet as may be formed during the manufacturing thereof and as will be explained in greater detail herein. The joint 67 can also be stronger than the adjacent core material, and without compromising the ability to score and snap break the backerboard sheet 60'. In other words, the backerboard sheet 60' may include first and second portions on opposite sides of the joint 67 aligned in end-to-end relation at respective opposing edges thereof, and an adhesive layer may be used to join the opposing edges of the first and second portions together.

The other elements of the backerboard sheet 60' indicated with prime notation and not specifically mentioned are similar to those elements described above with reference to the backerboard sheet 60 described above. Accordingly, these elements need no further discussion herein. Those of skill in the art will also appreciate that the various features of the embodiments of the wallboard sheets 60, 60' can be mixed and/or substituted in yet further embodiments of the invention. Because of the relative light weight of the backerboard sheets 60, 60' including aerated concrete, shipping, handling, and installation at a job site are facilitated.

Turning now additionally to the flowcharts of FIGS. 10–13 various method aspects for making the wallboard and/or backerboard sheets in accordance with the invention are now described. The method may include forming core material having opposing first and second major surfaces and comprising aerated concrete, securing at least one face layer on at least one of the first and second major surfaces of the core material, and cutting the core material and at least one face layer secured thereto into a plurality of wallboard or backerboard sheets. The provision of aerated concrete for the core provides many key advantages over conventional gypsum wallboard sheets, and/or conventional backerboard sheets, such as gypsum greenboard or cementitious backerboard, for example.

In one class of embodiments, the method may further comprise curing the core material prior to securing the at least one face layer thereto. In another class, the method may further comprise curing the core material after securing the at least one face layer thereto.

Figure 10:
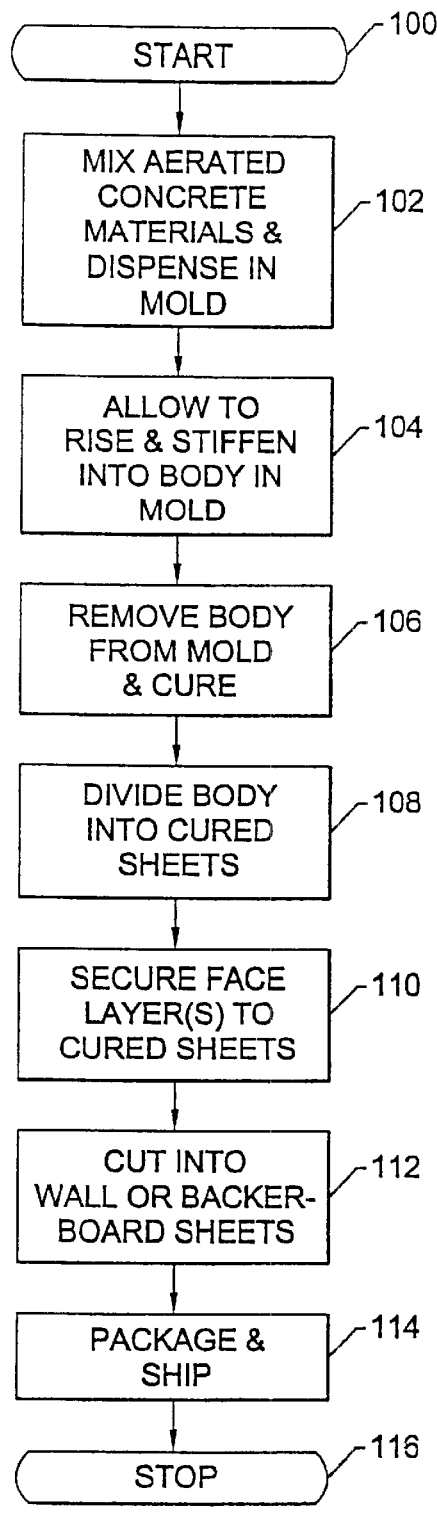
FIG. 10 is a flowchart for a first embodiment of a method for making wallboard and/or backerboard sheets in accordance with the invention.

Referring now to the flowchart of FIG. 10, a particularly advantageous embodiment is described wherein curing is performed before adding the at least one face layer. In particular, from the start (Block 100), the materials for making aerated concrete are mixed and dispensed into a suitable mold at Block 102. The materials are permitted to rise and stiffen into a body (Block 104), and the body may then be removed from the mold (Block 106). The body having a size of about twenty feet in length, four feet in height, and two feet in width is cured at Block 108, such as by positioning in an autoclave as will be appreciated by those skilled in the art. The one or more face layers can then be secured to the cured sheets of the core material at Block 110. Thereafter, the core material with the face layer(s) secured thereto can be cut to the desired lengths to form the wallboard or backerboard sheets at Block 112 before packaging/shipping (Block 114) and stopping or ending the method at Block 116.

In other words, in this embodiment forming the core material comprises dispensing materials for making aerated concrete into a mold and allowing the materials to rise and stiffen into a body, curing the body, and dividing the cured body into a plurality of cured sheets to serve as the core material. The plurality of the cured sheets may be joined together in end-to-end relation while advancing the cured sheets along a path of travel. In addition, securing the at least one face layer may be performed while the cured sheets are advanced along the path of travel.

Figure 11:
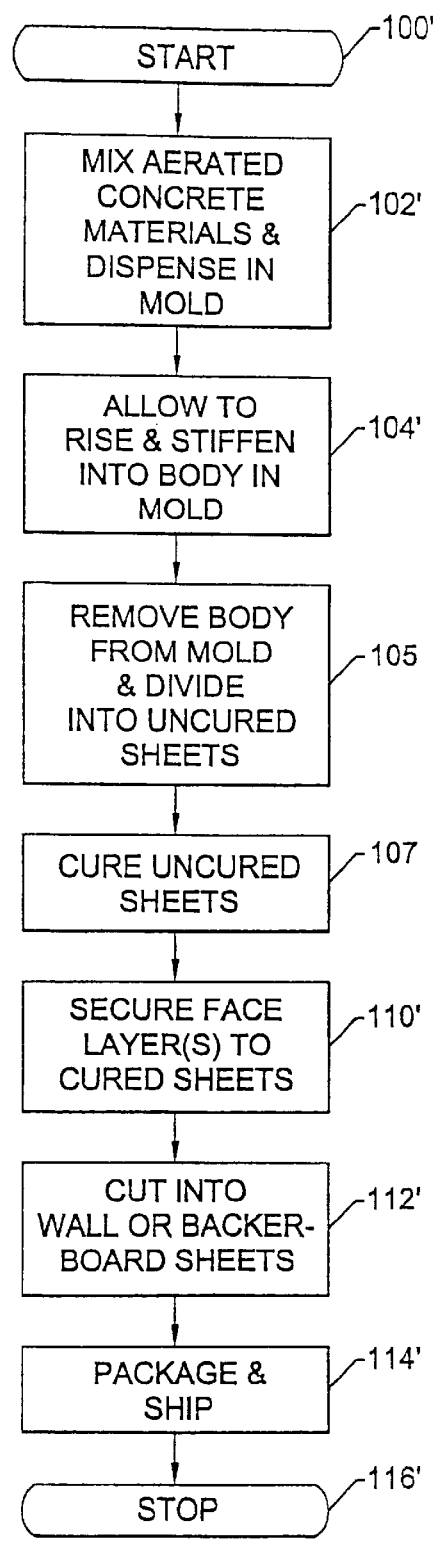
FIG. 11 is a flowchart for a second embodiment of a method for making wallboard and/or backerboard sheets in accordance with the invention.

A variation of this method embodiment is now explained with reference to the flowchart of FIG. 11. In this embodiment, prime notation is used to indicate similar steps which need no further explanation. In accordance with the illustrated embodiment of FIG. 11, the body is divided into sheets at Block 105, and is then cured at Block 107. Thereafter, the cured sheets are used as the core material and to which the face layer(s) are secured as described above. This embodiment may offer the advantage of slightly easier cutting of the body, since it has not been fully cured; however, the ultimate dimensional accuracy of the sheets may be less compared to first curing the body and then cutting the body into cured sheets. Of course, a combination of some cutting or shaping before curing and further cutting or shaping after curing are also contemplated by the present invention.

Figure 12:
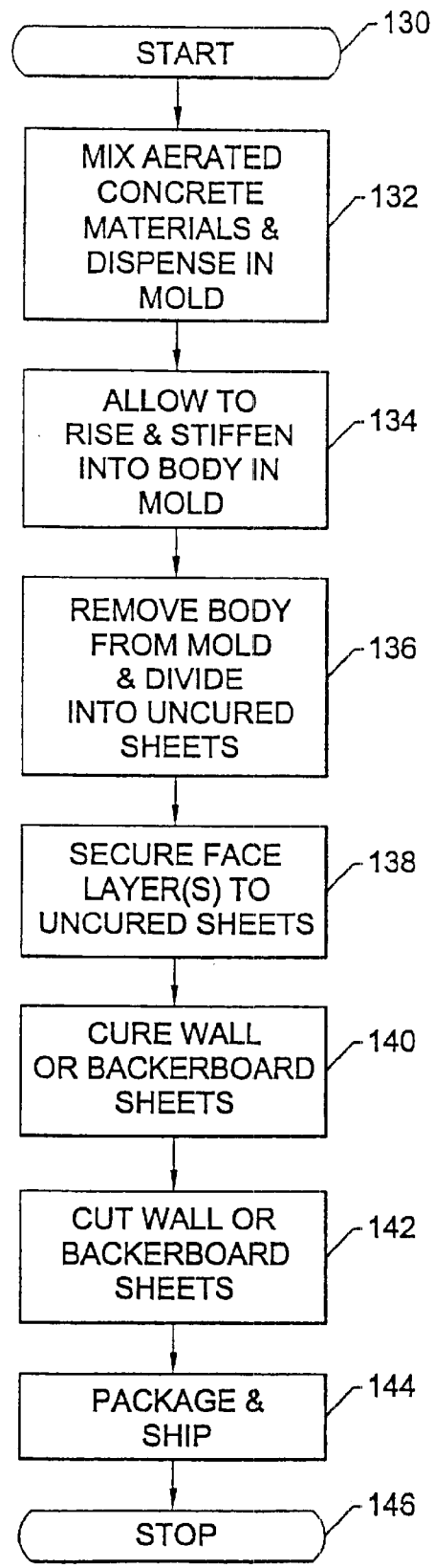
FIG. 12 is a flowchart for a third embodiment of a method for making wallboard and/or backerboard sheets in accordance with the invention.
Figure 13:
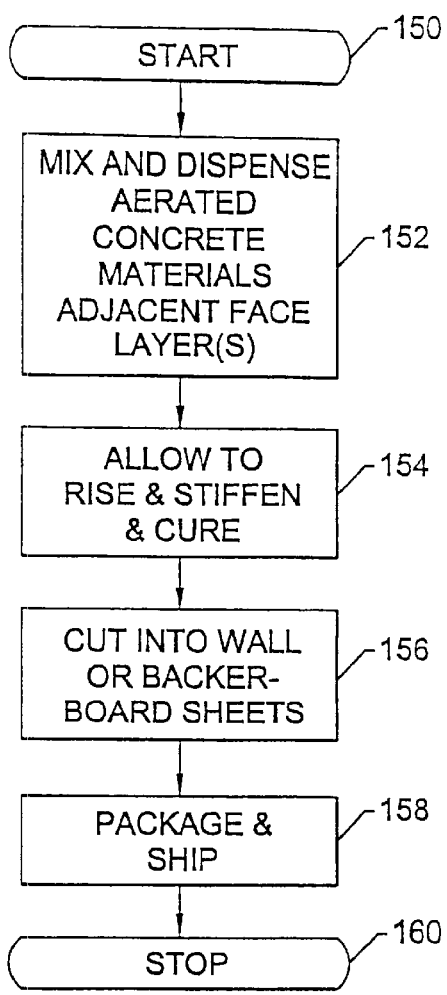
FIG. 13 is a flowchart for a fourth embodiment of a method for making wallboard and/or backerboard sheets in accordance with the invention.
Figure 14:
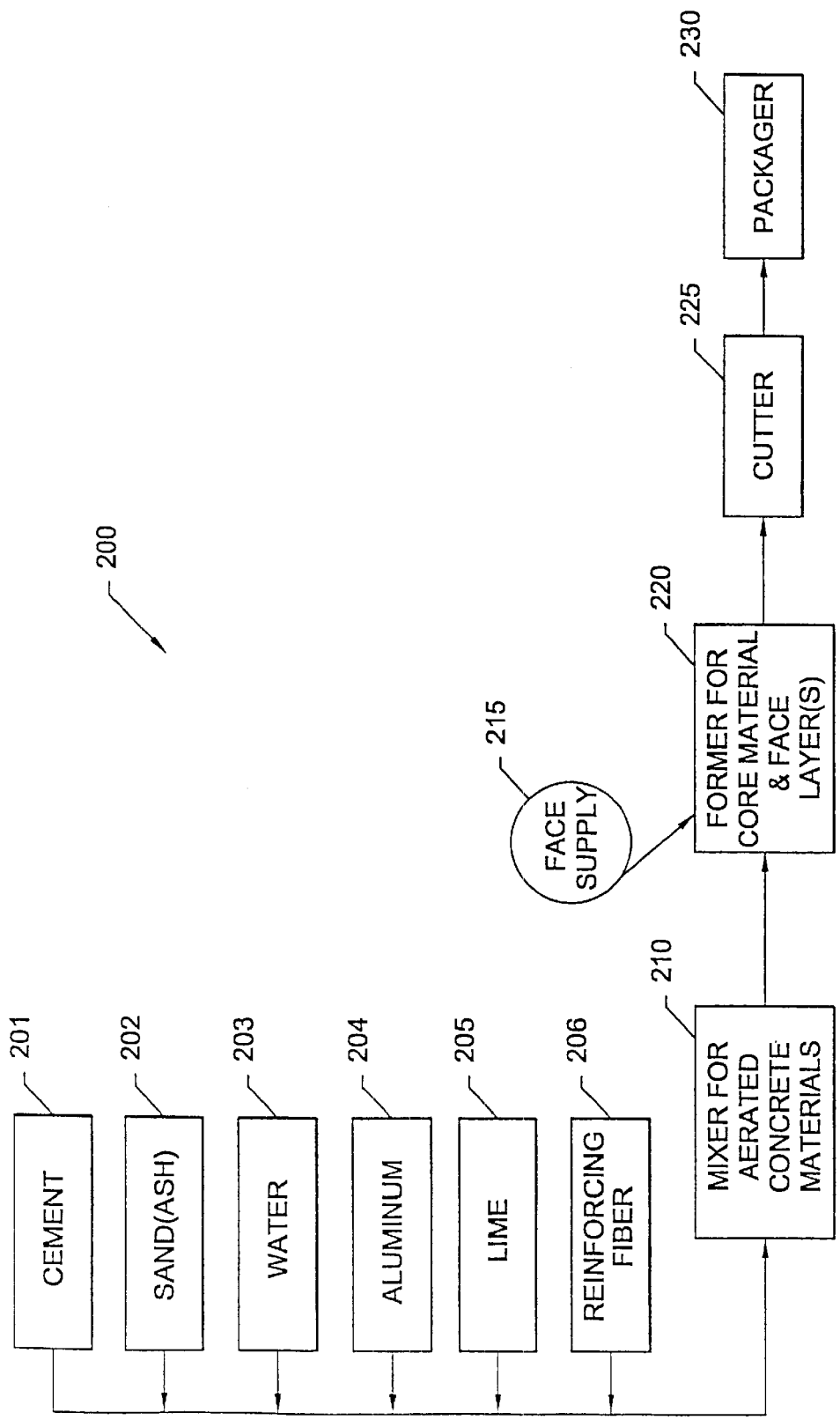
FIG. 14 is a schematic block diagram of a system for making wallboard and/or backerboard sheets in accordance with the invention.

Referring now more particularly to the flow charts of FIGS. 12 and 13, the second class of method embodiments, wherein the one or more face layers are added before final curing, are now described. It is noted that final curing using a conventional autoclave may place relatively difficult requirements on the characteristics of the face layers in terms of temperature resistance and/or abrasion resistance. Accordingly, manufacturing speed or efficiency may need to be considered in view of the increased face layer material costs as will be appreciated by those skilled in the art.

The first embodiment is now described with reference to the flowchart of FIG. 12. From the start (Block 130), the materials for making aerated concrete are mixed and dispensed into a suitable mold at Block 132. The materials are permitted to rise and stiffen into a body (Block 134), and the body may then be removed from the mold and divided into uncured sheets (Block 136). The one or more face layers may be secured to the uncured sheets at Block 138, which can then be cured (Block 140), before being cut into desired lengths at Block 142. The final sheets may be packaged and shipped at Block 144 before stopping or ending the method at Block 146. Of course, the final curing could also be performed prior to the cutting into individual sheets as will be appreciated by those skilled in the art.

Referring now to the flowchart of FIG. 13, yet another embodiment of the method is now described. This embodiment is directed to a more continuous manufacturing operation. More particularly, from the start (Block 150) the materials for making aerated concrete are dispensed in slurry form onto at least one face layer (Block 152), typically as the face layer is advanced along a conveyor, for example. The slurry may alternatively be dispensed onto a surface, e.g. a stainless steel surface, instead of directly onto the face layer. The dwell time on the conveyor may desirably be sufficient to allow the materials to rise and stiffen, and optionally cured, (Block 154) before cutting into final lengths (Block 156). Thereafter, the sheets may be packaged and shipped at Block 158 before stopping (Block 160). Of course in other embodiments, it is also possible to cut the core material before final curing. This may be especially desirably where conventional autoclave curing is performed which may require a relatively long dwell time in the heated chamber. However, other curing techniques, such as the addition of microwave radiation are also contemplated which may provide for near continuous curing of the core material as will also be appreciated by those skilled in the art.

Of course, in all of the specifically described and contemplated method embodiments, the securing of the at least one face layer may comprise securing first and second face layers on respective first and second major surfaces of the core material. The at least one face layer may comprise paper, such as for a wallboard. Alternately, the at least one face layer may be moisture-resistant for a backerboard. Forming may also include forming the first major surface of the core material to have beveled portions adjacent respective opposing longitudinal side edges. In addition, the at least one face layer may be secured to extend around the opposing longitudinal side edges by the use of simple edge wrapping guides, for example. The core material may also be formed with reinforcing fibers in the aerated concrete.

Turning now additionally to FIGS. 14–18 various aspects of a system for making the wallboard and/or backerboard including aerated concrete in accordance with the invention are now described. Starting with the overall simplified schematic diagram of FIG. 14 an illustrated embodiment of the system 200 is now described. The system 200 includes a mixer 210 for mixing materials for making aerated concrete. The mixer 210 is supplied with the starting materials for making aerated concrete from the cement supply 201, the sand (ash) supply 202, the water supply 203, the aluminum or other aeration agent supply 204, the lime supply 205, and the optional reinforcing fiber supply 206. The system also illustratively includes at least one face layer supply 215, a former 220 downstream from the mixer 210 and connected to the face layer supply 215. A cutter 225 is provided downstream from the former 220. And an optional packager 230 is provided, such as to package the wallboard or backerboard sheets onto pallets for shipping, for example.

The former 220 is for forming core material having opposing first and second major surfaces and comprising aerated concrete, and for securing at least one face layer from the at least one face layer supply 215 onto at least one of the first and second major surfaces of the core material. As described below, in one class of embodiments, the former 220 may further include an autoclave for curing the core material prior to securing the at least one face layer thereto. In another class, the former may further include an autoclave or other curing apparatus for curing the core material after securing the at least one face layer thereto.

One particularly advantageous embodiment of the system will now be explained with reference to the more detailed schematic diagram of the former 220 as shown in FIG. 15. More particularly, the illustrated embodiment of the former 220 may include a mold 240 downstream from the mixer for receiving the materials for making aerated concrete therein and allowing the materials to rise and stiffen into a body 242. The former 220 also includes the autoclave 243 downstream from the mold 240 for curing the body 242. Of course, the system would also include the necessary material handling mechanisms and apparatus to remove the body 242 and position it as will be appreciated by those skilled in the art.

The former 220 also includes a divider downstream from the autoclave for dividing the cured body 242 into a plurality of cured sheets to serve as the core material. One or more band saws 245, for example, could be used to slice the cured body 242 into a plurality of cured sheets 244. Other types of saws could also be used.

The former 220 may also include a conveyor 247 and a sheet handler 246 cooperating therewith for joining a plurality of the cured sheets 244 together in end-to-end relation while advancing the cured sheets along a path of travel on the conveyor. Alternatively, the cured sheets 244 may not be joined together, but may have already been cut in desired dimensions. The schematically illustrated end-to-end joiner 250 can provide the adhesive, alignment and compressive forces, if needed to insure a quality joint. Downstream from the joiner 250, a trim/bevel station 252 can be used to trim the upper and/or side surfaces of the sheets, and also to form the desired beveled sides if desired.

Both the joiner 250 and trim/bevel station 252 can be readily made from conventional equipment and need no further discussion herein. What is noted, however, is that the aerated concrete is readily workable unlike conventional concrete, for example. A waste collection system may also be provided to collect and recycle trimmed or cut material from the aerated concrete as will be appreciated by those skilled in the art.

Downstream from the trim/bevel station 252, the former 220 also illustratively includes a securing station 253 to apply the one or more face layers from the appropriate supplies 254, 255. This securing station 253 can use conventional layer handling, guiding rolls, etc. to attach the at least one face layer while the cured sheets 244 are advanced along the path of travel. The securing station 253 can also include the necessary guides and rolls to roll a face layer around the longitudinal side edges as described above.

Turning now briefly to FIG. 16 a variation of the former embodiment described above will now be described. In this embodiment of the former 220', the body 242' is cut or divided into sheets 244' before positioning in the autoclave 243'. As discussed above, while the cutting may be somewhat easier, and a more simple wire saw 249 may be used, the resulting dimensions of the sheets may not be as accurate. This embodiment does, however, avoid the need for higher temperature compatible/resistant face layers. Of course, combinations of pre-cure and post-cure shaping of the core material may also be used.

Turning now more particularly to FIG. 17 another variation or embodiment of a former 220" is now described. In this embodiment, the face layers from the supplies 254", 255" are added downstream from dividing the body 242" into uncured sheets 244" but before positioning in the autoclave 243" for curing. As noted above this may increase the requirements and costs for the face layers, but may provide increased manufacturing efficiencies as will be appreciated by those skilled in the art. As shown, uncured sheets 244" may also be passed through cutter 225" prior to the autoclave 243". Of course, the various core shaping operations may also be performed on the uncured sheets to form beveled edges, etc.

A further embodiment of the former 220''' is described with reference to FIG. 18. This embodiment of the system may provide for near continuous production. In this embodiment, the former 220''' may comprise a slurry dispenser (and spreader) 260 and a conveyor 247''' cooperating therewith for dispensing the materials for making aerated concrete adjacent at least one face layer, such as from supply 254''', as the at least one face layer is advanced along a path of travel. The securing station 253''' secures the second face layer from the supply 255''' and may wrap the edges in the illustrated embodiment. Again, the slurry may also be dispensed directly onto a surface, such as a stainless steel surface, instead of onto the at least one face layer, with the first and second face layers being secured by the securing station 253''' thereafter. In this embodiment, the autoclave or other curing station 243''' is downstream from the dispenser for curing the materials for making aerated concrete. The autoclave 243''' may preferably be after the cutter 225''', for example, but the autoclave or other curing device may be positioned along the conveyor 247'''. Typically, curing takes between 4 and 12 hours at a temperature of about 165° C. and pressure of about 150 psi. It is expected that the time from pouring the mixture onto the conveyor to cutting the sheet into final lengths will vary between 20 and 50 minutes depending on the relative percentage of cement, lime and aluminum.

In any of the embodiments, the former may secure first and second face layers on respective first and second major surfaces of the core material. For wallboard sheets, the at least one face layer supply may comprise at least one paper face layer supply. For backerboard sheets, the at least one face layer supply preferably comprises at least one moisture-resistant face layer supply.

Other related concepts and features are disclosed in the following copending patent applications filed concurrently herewith and assigned to the assignee of the present invention and are entitled WALLBOARD SHEET INCLUDING AERATED CONCRETE CORE, Ser. No. 09/680,742; SYSTEM FOR MAKING WALLBOARD OR BACKERBOARD SHEETS INCLUDING AERATED CONCRETE, Ser. No. 09/684,848; and BACKERBOARD SHEET INCLUDING AERATED CONCRETE CORE, Ser. No. 09/680,721 the entire disclosures of which are incorporated herein in their entirety by reference.

It is also contemplated that the wallboard and backerboard sheets described herein may be produced without the face layers if sufficient strength and surface smoothness can be obtained by use of the fibrous filler material alone, for example. However, it is recognized that any filler material will add weight and that the volume of fibrous material is a trade off with weight and strength or flexibility. Thus, it may be desirable to use just enough fibrous material to produce some slight flexibility without addressing surface smoothing. Accordingly, many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that other modifications and embodiments are intended to be included within the scope of the appended claims.

That which is claimed is:

1. A method for making wallboard or backerboard sheets comprising:

mixing and dispensing materials for making aerated concrete adjacent at least one face layer advancing along a path of travel;

permitting the aerated concrete materials to rise and stiffen to define core material having first and second opposing surfaces with the at least one face layer secured thereto;

cutting the core material and at least one face layer secured thereto into a plurality of uncured wallboard or backerboard sheets; and curing the uncured wallboard or backerboard sheets in an autoclave.

2. A method according to claim 1 wherein the at least one face layer comprises first and second face layers on respective first and second major surfaces of the core material.

3. A method according to claim 1 wherein the at least one face layer comprises paper.

4. A method according to claim 1 wherein the at least one face layer is moisture-resistant.

5. A method according to claim 1 further comprising forming the first major surface of the core material to have beveled portions adjacent respective opposing longitudinal side edges.

6. A method according to claim 1 wherein the at least one face layer extends around the opposing longitudinal side edges.

7. A method according to claim 1 further comprising adding reinforcing fibers to the aerated concrete.

* * * * *